United States Patent [19]

Campbell

[11] 4,249,257

[45] Feb. 3, 1981

[54] RADIO FREQUENCY SIGNALS ANALYZER

[75] Inventor: Kenneth J. Campbell, Solana Beach, Calif.

[73] Assignee: The United States of America as represented by the Secretary of the Navy, Washington, D.C.

[21] Appl. No.: 829,756

[22] Filed: Sep. 1, 1977

[51] Int. Cl.³ .................. H04B 1/02; H04B 17/00
[52] U.S. Cl. ......................... 455/115; 324/76 R; 324/78 Z; 329/124
[58] Field of Search .............. 325/67, 134, 133, 363; 324/78 Z, 76 R, 118, 79 R; 329/111, 122, 124, 129; 334/31; 455/108, 115, 113, 125

[56] References Cited

U.S. PATENT DOCUMENTS

| 2,309,481 | 1/1943 | Summerhayes, Jr. | 325/134 |
|---|---|---|---|
| 3,487,313 | 12/1969 | Cushman et al. | 325/134 |
| 3,649,909 | 3/1972 | Ort et al. | 325/134 |
| 3,914,693 | 10/1975 | Ohlen | 325/134 |
| 3,992,670 | 11/1976 | Gittins | 455/115 |
| 4,047,121 | 9/1977 | Campbell | 325/67 |

Primary Examiner—Jin F. Ng
Assistant Examiner—Tommy P. Chin
Attorney, Agent, or Firm—Richard S. Sciascia; Ervin F. Johnston; Thomas M. Phillips

[57] ABSTRACT

An analyzer for analyzing radio frequency signals from an FM/PM transmitter without prior knowledge of the transmitting frequency. The RF signal is sampled and fed to a mixer where it is mixed with the output from a comb generator having a PRF equal to the transmitter channel spacing. The signal out of the mixer is filtered to remove all but the desired frequency components. The filtered signal is fed to a frequency discriminator which provides a demodulated form of the transmitted RF signal and is fed to various parameter indicators.

12 Claims, 1 Drawing Figure

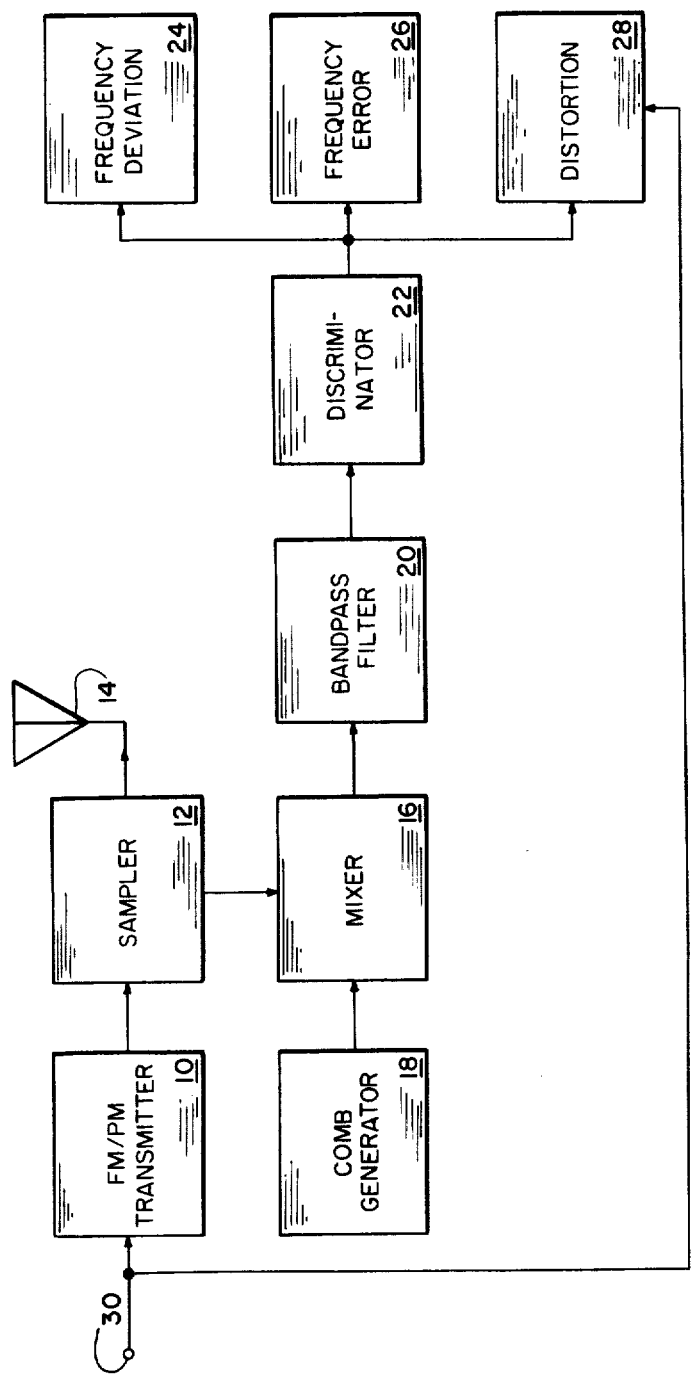

RADIO FREQUENCY SIGNALS ANALYZER

Background of the Invention

The present invention relates to a frequency analyzing device which will allow simple and straightforward quantitative analysis of radio frequency (RF) signals, to the extent that complex test equipment may be deemed unnecessary. And further, and more specifically, to provide a device which is readily applicable to automated testing of frequency modulated and phase modulated RF transmitter parameters. Present techniques of analyzing the FM/PM transmitter performance require the utilization of the spectrum analyzers, frequency counters, deviation meters, and wave analyzers. These are complex equipments and require skilled and trained personnel for proper operation. Further, the equipment complexity precludes easy adaptability to an automated testing approach. Also in systems of the type shown in U.S. Pat. No. 2,309,481, if more than one band is to be monitored and analyzed then a variable frequency oscillator or oscillators of more than one frequency must be utilized.

Summary of the Invention

The present invention overcomes the disadvantages of the prior known systems by providing a device which is simple and straightforward and does not require complicated equipment and highly trained personnel to operate. The RF signal to be analyzed is sampled and fed to a mixer where it is mixed with the output from a comb generator having a PRF equal to the transmitter channel spacing. The resultant output from the mixer is passed through a bandpass filter to remove all but the desired frequency components and fed to a frequency discriminator or demodulator. The output of this discriminator, being a demodulated form of the transmitted RF signal, lends itself to simple analysis techniques which accurately represent parameters of the transmitted RF signal. Specifically, the frequency deviation of the RF signal is directly proportional to the amplitude of the discriminator output; the transmitter frequency error is directly proportional to the dc output value of the discriminator. Distortion can also be determined by feeding a known signal to the transmitter modulator and comparing it to the demodulator output.

Objects of the Invention

An object of the invention is the provision of an analyzer for analyzing radio frequency signals from an FM/PM transmitter without prior knowledge of the transmitting frequency.

Another object is the provision of a frequency analyzing device which will allow simple and straightforward quantitative analysis of radio frequency signals by sampling the transmitted signal and mixing the sampled signal with the output of a comb generator.

A further object of the invention is the provision of a single comb generator operating at a single PRF to enable analyzing a transmitter transmitting on a wide number of channels and providing a replica of the transmitted RF signal at 200 KHz.

Other objects and many of the attendant advantages of this invention will be readily appreciated as the same becomes better understood by reference to the following detailed description when considered in connection with the accompanying drawings.

Description of the Preferred Embodiment

Referring now to the drawings wherein there is shown in the single FIGURE a preferred embodiment of the invention, an analyzer for measuring the frequency deviation, frequency error, and distortion, in accordance with the teachings of the invention. The RF output from FM/PM transmitter 10 is sampled by means of any well known sampling device 12 as by induction into a coil as shown in U.S. Pat. No. 2,309,481. Since the amount of power sampled by device 12 is very small, the remainder of the transmitted energy is fed to transmitting antenna 14 essentially unaffected. The sample RF signal is fed to mixer 16 where it is mixed with the output of a comb generator 18 having a pulse repetition rate (PRF) equal to the transmitter channel spacing of transmitter 10. Comb generator 18 may be of the step recovery diode type such as that shown and described in my U.S. Pat. No. 4,047,121 for "An RF Signal Generator," issued Sept. 6, 1977. The resultant output from mixer 16 is passed through a bandpass filter 20, to remove all but the desired frequency components, to frequency discriminator 22. The output from discriminator 22 is fed to a frequency deviation indicator 24, frequency error indicator 26 and distortion indicator 28. Distortion is determined by feeding a known signal to transmitter 10 through input terminal 30 and also feeding the same signal to the distortion indicator 28 for comparison.

By way of example, assume an FM transmitter which can transmit on any one of 1,750 equally spaced channels between 225 MHz and 400 MHz. The channel spacing is 100 KHz. The baseband bandwidth is 20 KHz. As described above, the transmitting signal is sampled and fed to mixer 16. Comb generator 18 with a PRF of 100 KHz is mixed with the sample signal in mixer 16. An important feature of the invention is that regardless of the frequency of the channel on which transmitter 10 is operating, a replica of the transmitted RF signal will be generated on 200 KHz. Bandpass filter 20, designed to pass only the band 150 KHz, to 250 KHz, removes all unwanted product terms while leaving the desired signal unaltered. The output of bandpass filter 20 is then fed to frequency discriminator 22, which is designed to have a center frequency of 200 KHz. Discriminator 22 demodulates the signal and outputs the demodulated form of the transmitted RF signal. Various indicator means are provided at the output of discriminator 22 to provide frequency deviation, frequency error and frequency distortion.

Obviously many modifications and variations of the present invention are possible in the light of the above teachings. It is therefore to be understood that within the scope of the appended claims the invention may be practiced otherwise than as specifically described.

What is claimed is:

1. Apparatus for analysis of FM and PM radio frequency signals transmitted by a multi-channel radio frequency transmitter having a plurality of equally spaced channels without regard to the selection of a channel, comprising:
   (a) means for sampling said transmitted radio frequency signals;
   (b) means for generating a first signal having a frequency spectrum wherein each frequency is separated from an adjacent frequency by a distance equal to the channel spacing of said transmitter;

(c) means coupled to said sampling means and to said generating means for mixing said first signal and said sampled signal thereby to produce an output including a replica of said transmitted signal at a predetermined frequency.

2. The apparatus of claim 1 further comprising a bandpass filter coupled to said mixer means for passing only said replica signal.

3. The apparatus of claim 1 further comprising means coupled to said mixer means for processing said replica signal to determine the operating characteristics of said transmitted signal.

4. The apparatus of claim 1 wherein said generating means is a comb generator.

5. The apparatus of claim 4 wherein said comb generator is of the step recovery diode type.

6. The apparatus of claim 5 wherein said comb generator has a pulse repetition frequency equal to the channel spacing of said transmitter.

7. The apparatus of claim 2 wherein said bandpass filter is tuned to the predetermined frequency of the replica signal.

8. The apparatus of claim 2 wherein said generating means is a comb generator.

9. The apparatus of claim 8 wherein said comb generator is of the step recovery diode type.

10. The apparatus of claim 9 wherein said comb generator has a pulse repetition frequency equal to the channel spacing of said transmitter.

11. The apparatus of claim 1 wherein said predetermined frequency is 200 kHz.

12. The apparatus of claim 2 wherein the bandpass of said bandpass filter is 150 kHz to 250 kHz.

* * * * *